United States Patent
Joo et al.

(10) Patent No.: US 6,635,571 B2
(45) Date of Patent: Oct. 21, 2003

(54) PROCESS FOR FORMING ALUMINUM OR ALUMINUM OXIDE THIN FILM ON SUBSTRATES

(75) Inventors: Seung Ki Joo, Sampoong Apt. 22-201, 1685 Seocho-dong, Seocho-ku, Seoul (KR); Jang Sik Lee, Pusan (KR); Chang Wook Jeong, Seoul (KR)

(73) Assignee: Seung Ki Joo, Seoul (KR)

( * ) Notice: Subject to any disclaimer, the term of this patent is extended or adjusted under 35 U.S.C. 154(b) by 14 days.

(21) Appl. No.: 09/841,072

(22) Filed: Apr. 25, 2001

(65) Prior Publication Data

US 2002/0081394 A1 Jun. 27, 2002

(30) Foreign Application Priority Data

Dec. 22, 2000 (KR) ........................................ 2000-80425

(51) Int. Cl.$^7$ ............................................... H01L 21/44
(52) U.S. Cl. ...................... 438/688; 438/660; 438/680; 438/778
(58) Field of Search ................................ 438/688, 778, 438/660, 680

(56) References Cited

U.S. PATENT DOCUMENTS 6,077,571 A * 6/2000 Kaloyeros et al. ........... 438/688
6,130,160 A * 10/2000 Vaartstra ..................... 438/688

OTHER PUBLICATIONS

Y. Kim, S.M. Lee, et al., Substrate Dependence on the Optical Properties of A1203 Films Grown by Atomic Deposition, Dec. 22, 1997, pp. 3604–3606; Appl. Phys. 71 (25), USA.

A.W. Ott, et al., A1303 Thin Film Growth on Si(00) Using Binary Reaction Sequence Chemistry, 1997, pp. 135–144, Thin Solid Films 292 (1997), U.S.A.

Kaupo Kukli, et al., Atomic Layer Epitaxy Growth of Aluminum Oxide Thin Films from a Novel Al(Ch0)2C1 Precursor & H20, Jul./Aug. 1997, pp. 2214–2218, J. Yac. SC & Technol. A 15(4), USA.

* cited by examiner

Primary Examiner—John F. Niebling
Assistant Examiner—Lynne Gurley
(74) Attorney, Agent, or Firm—Rosenberg, Klein & Lee

(57) ABSTRACT

Disclosed is a process for depositing an aluminum oxide thin film necessary for semiconductor devices. The process includes the steps of: subjecting a gaseous organoaluminum compound as an aluminum source in contact with a target substrate and depositing aluminum using plasma. The steps are sequentially repeated to form an aluminum thin film, and further includes the step of oxidizing the aluminum thin film using oxygen plasma. This deposition cycle is repeated to obtain an aluminum oxide thin film. The present invention uses an aluminum source containing less contaminant compared to the prior art, thus obtaining aluminum oxide of high quality. Furthermore, the temperature of the gas supply and the reactor can be lowered in relation to the prior art method to reduce costs in the fabrication of semiconductor devices.

12 Claims, 4 Drawing Sheets

PROCESS FOR FORMING ALUMINUM OR ALUMINUM OXIDE THIN FILM ON SUBSTRATES

BACKGROUND OF THE INVENTION

1. Field of the Invention

The present invention relates to a process for forming an aluminum or aluminum oxide thin film and, more particularly, to a process for forming an aluminum or aluminum oxide thin film necessary to semiconductor devices.

2. Description of the Related Art

Aluminum oxide is an electrical insulator that causes visible rays to pass through. Also, aluminum oxide is a hard and strong material resistant to the attack of almost all chemicals. Aluminum oxide layers may act as a superior barrier against diffusion of many materials such as sodium. Such an aluminum oxide may be broadly used in many applications including passivation layer of semiconductor devices, gate oxide layer, insulating layer, diffusion barrier layer, dielectric layer, and the like as well as optical uses (Reference 1: Y. Kim, S. M. Lee, C. S. Park, S. I. Lee, and M. Y. Lee, Applied Physics Letters, vol. 71, p. 3604 (1997)). An extremely thin film of aluminum oxide may also be formed on the PZT ($Pb(ZrTi)O_3$) dielectric layer of FeRAM (Ferroelectric Random Access Memory) and used as a diffusion barrier layer against penetration of hydrogen (Reference 2: Sang-Min Lee, Young-Kwan Kim, In-Sun Park, Chang-Soo Park, Cha-Young Yoo, Sang-In Lee, and Moon-Yong Lee, The Abstracts of the $5^{th}$ Korean Semiconductor Academy Meeting, p 255 (1998)).

In contrast to the conventional chemical deposition method which involves simultaneous supply of sources of components constituting a thin film, sequential supply of materials allows formation of a thin film only with chemical reactions on the surface of a substrate, thus providing thickness uniformity over large areas, excellent conformality, and the growth rate of the thin film is proportional to the number of source supply cycles rather than time, as a result of which the thickness of the thin film can be controlled precisely (Reference 3: T. Suntola and M. Simpson eds. Atomic Layer Epitaxy, Blackie, London (1990)).

In the growth of aluminum oxide films using the atomic layer deposition, the source of aluminum is trichloroaluminum ($AlCl_3$), trimethylaluminum ($Al(CH_3)_3$) or dimethylchloroaluminum ($Al(CH_3)_2Cl$), that of oxygen being water vapor ($H_2O$), hydrogen peroxide ($H_2O_2$) or nitrogen monoxide ($N_2O$) (Reference 4: Kaupo Kukli, Mikko Ritta, Markku Leskela and Janne Jokinen, J. Vac. Sci. Technol., A 15 (4), 2214 (1997)).

In the conventional atomic layer deposition, the surface reaction between aluminum and oxygen sources occurs in association with thermal decomposition reaction to grow aluminum oxide thin films so that the growth temperature has a great effect on the characteristics of the thin films, such as film composition, refractive index, dielectric constant, leakage current, and the like (Reference 5: A. W. Ott, J. W. Klaus, J. M. Johnson and S. M. George, Thin Solid Films, 292, 135 (1997)). That is, the aluminum oxide films grown at a low growth temperature have deteriorated characteristics including film composition, refractive index, dielectric constant, etc. due to contamination of the films with chlorine and carbon. On the other hand, the aluminum oxide films grown at a high growth temperature may have high refractive index and dielectric constant but deteriorated electric characteristics such as leakage current or fracture electric field.

SUMMARY OF THE INVENTION

It is, therefore, an object of the present invention to provide a process for forming aluminum or aluminum oxide thin films using aluminum and oxygen sources not contaminated with chlorine or carbon.

To achieve the above object of the present invention, there is provided a process for forming an aluminum film including the steps of: subjecting an organoaluminum compound as an aluminum source in contact with a target substrate for deposition using a carrier gas to cause a dissociation reaction of the compound; and introducing an energy source onto the substrate to form an aluminum film through a decomposition reaction (i.e. reduction) of the material adsorbed on the substrate.

In another aspect of the present invention, there is provided a process for forming an aluminum oxide film including the steps of: subjecting an organoaluminum compound as an aluminum source in contact with a target substrate for deposition using a carrier gas to cause a dissociation reaction of the compound; introducing an energy source onto the substrate to form an aluminum film through a decomposition reaction of the material adsorbed on the substrate; and introducing an oxygen-containing gas and a heat energy source to oxidize the aluminum film.

Preferably, the temperature of the substrate is maintained at less than 100° C. for a metal substrate, and less than 150° C. for an oxide substrate such as $SiO_2$. Above the temperature, aluminum deposition occurs due to thermal decomposition reaction on the substrate.

The organoaluminum compound used as a deposition source is largely divided into alkyl- and alane-based sources. Examples of the alkyl-based source include triisobutyl aluminum (TIBA) and dimethyl-aluminum hydride (DMAH). Examples of the alane-based source include trimethyl-amine alane (TMAA), triethylamine alane (TEAA), and dimethylethyl-amine alane (DMEAA). The alane-based source is a compound in which amine as a nitrogen compound is coordinated with alane bonded to three hydrogens and free from Al—C bonds, as a result of which a high-purity thin film can be obtained. Preferably, use is made of an amine-alane-based source in which a nitrogen compound, i.e., amine has a weak bond to alane having three hydrogens associated with aluminum. More preferably, the organoaluminum compound is DMEAA.

Preferably, the carrier gas is any one selected from the group consisting of hydrogen, argon, helium, and nitrogen. More preferably, the carrier gas is hydrogen. The hydrogen atmosphere in the reactor not only stabilizes the Al—N bond in the gaseous phase but also prevents leaving of alane from hydrogen, thus stabilizing the alane.

The energy source used for reduction of alane adsorbed to the surface of the substrate to deposit aluminum is heat energy, plasma energy, light energy (e.g., laser, ultraviolet rays, infrared rays, etc.), and the like. For plasma energy, argon, helium or hydrogen plasma may be used. Hydrogen plasma is preferable, because the hydrogen atmosphere stabilizes the Al—N bond in the gaseous phase and inhibits gas dissociation of DMEAA.

The number of times of aluminum deposition prior to the oxidization step (i.e., the number of aluminum films to be deposited) is optionally controllable. That is, the step of oxidization after n times of aluminum deposition is repeated to deposit multi-layered aluminum oxide films.

Besides, the deposition time period, i.e., injection time of the aluminum source, injection time period of a purging gas, and time period for applying plasma energy can also be controlled.

As for the energy source required to oxidize the laminated aluminum film, a gas such as vapor ($H_2O$), hydrogen peroxide ($H_2O_2$), nitrogen monoxide ($N_2O$), oxygen ($O_2$), or ozone ($O_3$) is used to supply heat energy, light energy (e.g., laser, ultraviolet rays, infrared rays, etc.) or plasma energy.

The plasma oxidization method is preferably used in oxidization of the laminated aluminum thin film, in which the plasma gas is an oxygen-containing gas and preferably contains high-purity oxygen.

DETAILED DESCRIPTION OF THE PREFERRED EMBODIMENT

Hereinafter, the present invention will be described in detail by way of the following examples and experimental examples, which are not intended to limit the scope of the present invention.

According to the present invention, the temperature of the substrate was constant at 100° C. DMEAA was blown into a deposition chamber for 120 seconds through bubbling of a hydrogen carrier gas, after which the DMEAA supply was interrupted. After 120 seconds of pumping, a hydrogen purge gas was blown into the deposition chamber with the pressure stabilized at about 30 mTorr and weak hydrogen plasma was applied for 30 seconds. This procedure provided a single aluminum deposition layer and was iterated five times to form five aluminum deposition layers.

After 120 seconds of pumping, a high-purity oxygen gas was injected into the deposition chamber with the pressure stabilized at about 30 mTorr and weak oxygen plasma was applied to oxidize the aluminum deposition layer, thereby producing an aluminum oxide layer.

All the above procedures, which constituted one deposition cycle of aluminum oxide, were iterated to form multilayered aluminum oxide thin films.

Figure 1:
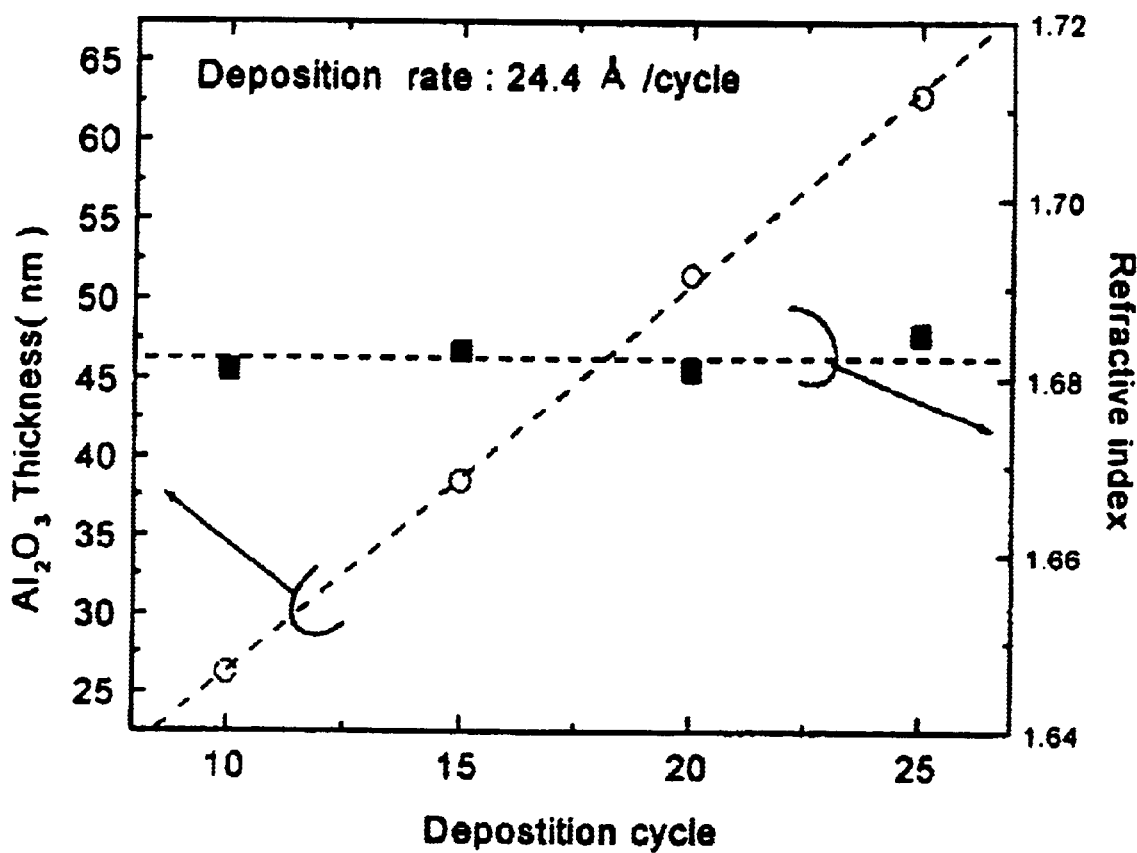
FIG. 1 illustrates a process of growing an aluminum oxide thin film in proportion to the deposition cycle on a silicon (Si) substrate in a process of the present invention.

FIG. 1 shows the relationship between the deposition cycle and the thickness of the aluminum oxide thin film according to the present invention. In the figure, the y-axis on the left side represents the thickness of the aluminum oxide thin film, which is linearly proportional to the number of times of the deposition process (i.e., oxidization process after five times of aluminum deposition). This means that the thickness of the aluminum oxide thin film can be precisely controlled in the process of the present invention.

In FIG. 1, the y-axis on the right side represents the refractive index of the aluminum oxide thin film, which has a constant value of greater than 1.68 irrespective of the number of times of the deposition process. This means that a dense aluminum oxide thin film can be obtained without respect to the number of times of the deposition process.

Figure 2:
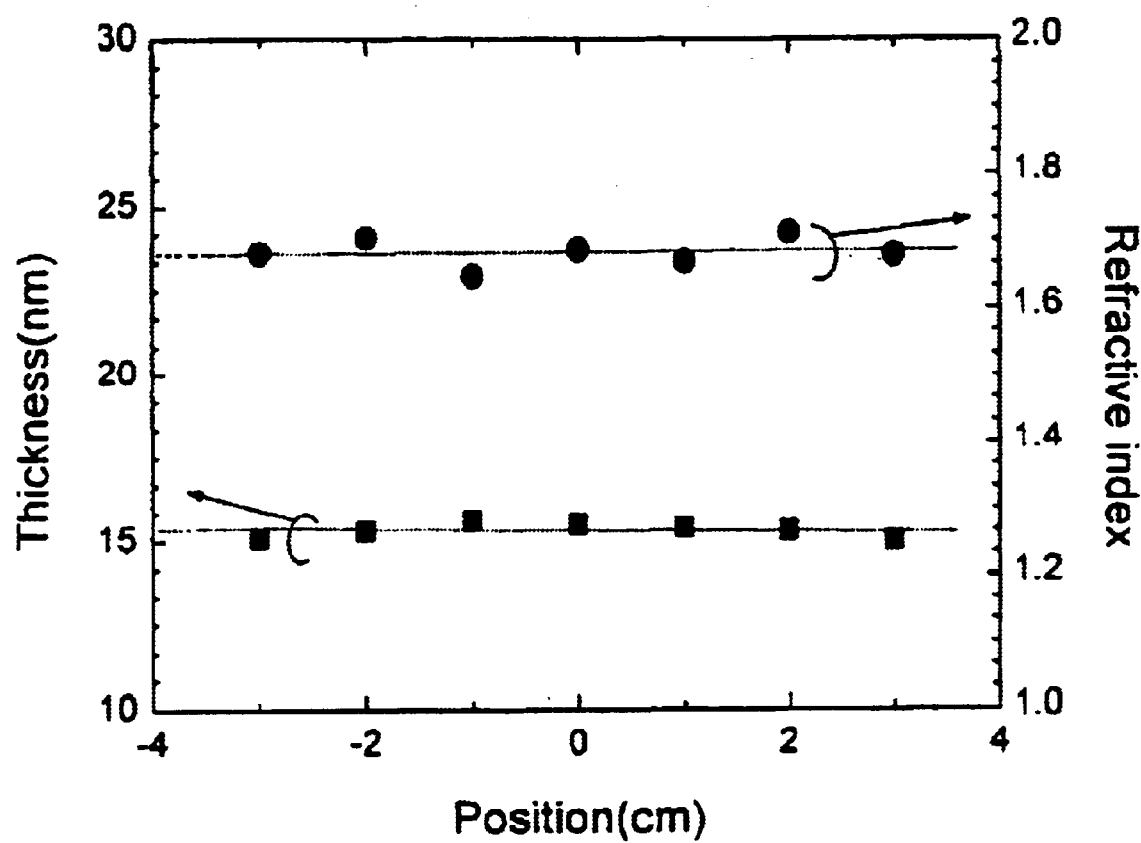
FIG. 2 shows the thickness uniformity (±2.3%) and refractive index uniformity (±1.9%) of an aluminum oxide thin film grown in the present invention.

FIG. 2 shows the thickness uniformity (±2.3%) and refractive index uniformity (±1.9%) of an aluminum oxide thin film grown on a 4 inch-thickness Si substrate according to the present invention. It can be seen that the characteristics of the aluminum oxide thin film are uniform on a relatively large-area substrate.

Figure 3:
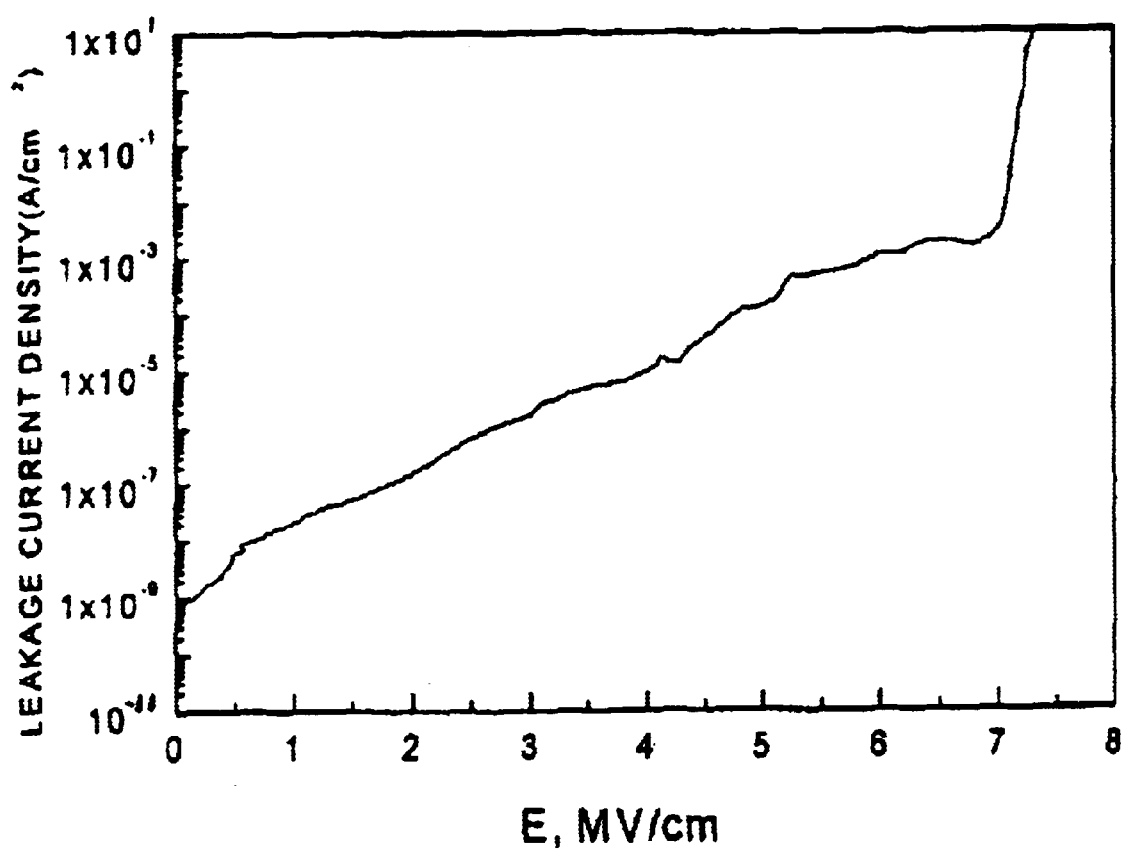
FIG. 3 shows the electrical characteristics of an aluminum oxide thin film having a thickness of 15 nm grown in the present invention.

FIG. 3 shows that the aluminum oxide thin film has a leakage current of less than $10^8$ A/cm$^2$ under less than 1 MV/cm, and a high breakdown field of about 7 MV/cm.

Figure 4:
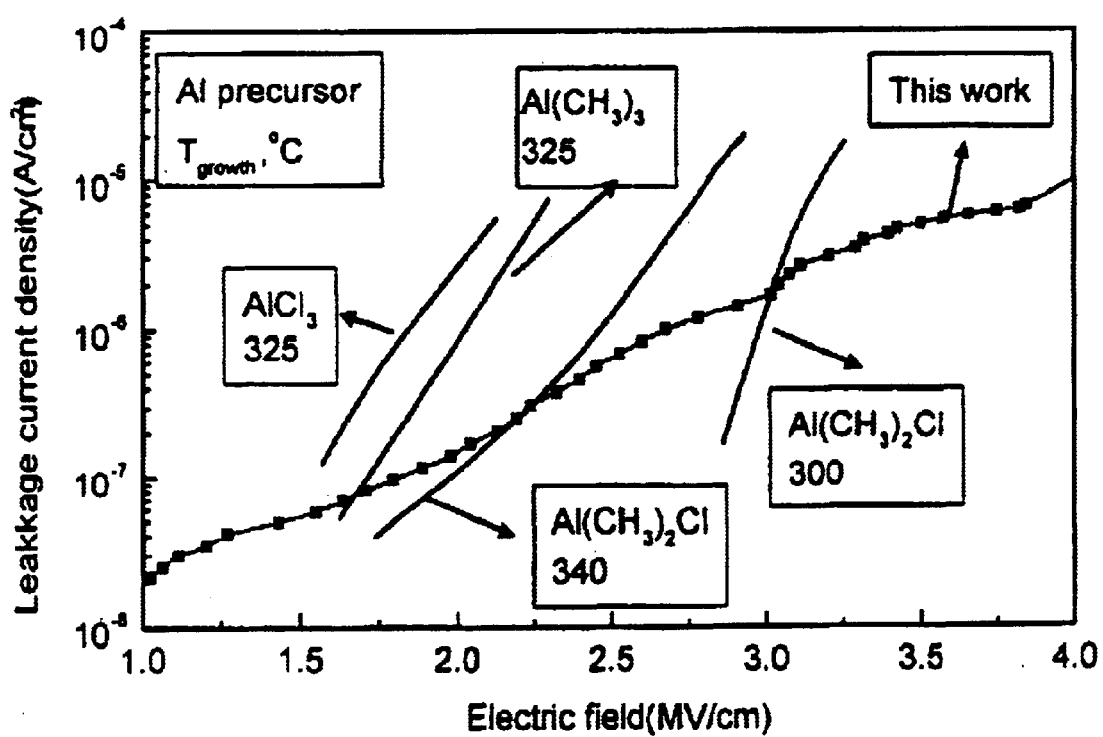
FIG. 4 shows the electrical characteristics of an aluminum oxide thin film having a thickness of 15 nm grown in the present invention and an aluminum oxide thin film having a thickness of 140 to 180 nm obtained in the prior art.

FIG. 4 compares the leakage current between an aluminum oxide thin film having a thickness of 15 nm grown according to the present invention and an aluminum oxide thin film having a thickness of 140 to 180 nm obtained using the conventional atomic layer deposition where the aluminum oxide thin film is deposited due to thermal decomposition reaction between aluminum and oxygen sources with the aluminum source being $AlCl_3$, $Al(CH_3)_2$, $Al(CH_3)_2Cl$.

The aluminum oxide thin film of the prior art exhibited a low refractive index of 1.59 to 1.63 with a low leakage current value, while that of the present invention had excellent electrical characteristics as well as a high refractive index of greater than 1.68. In FIG. 4, compared to the aluminum oxide thin film of the prior art, the aluminum oxide thin film of the present invention had a smaller increment of the leakage current with an increase in the electric field represented on the x-axis, that is, "slope". This means that the aluminum oxide thin film of the present invention had a greater resistance. It is thus apparent that the denser thin film can be obtained with high refractive index in the present invention.

As described above, the present invention has the following effects:

(1) It provides a high-purity aluminum oxide thin film having a high electric resistance and a high transparency to light;

(2) It allows deposition of aluminum oxide from a chemical source of aluminum that is readily vaporized with few non-volatile residue and not subjected to spontaneous combustion, with less risk of contamination with chlorine and carbon;

(3) It uses the plasma energy that lowers the temperature of the reactor;

(4) It deposits aluminum oxide with excellent thickness control characteristic and uniformity;

(5) It provides a chemical deposition process for aluminum oxide from relatively innoxious reactants commercially available and stable; and (6) It provides an effective and economical process for fabricating aluminum oxide thin films.

What is claimed is:

1. A process for forming an aluminum film comprising the steps of:

providing a target substrate and maintaining the target substrate at a temperature less than 100° C.;

contacting an organoaluminum compound as an aluminum source with the target substrate for deposition using a carrier gas to cause a dissociation reaction of the compound; and introducing an energy source to the substrate to form an aluminum film through a decomposition reaction of the material adsorbed on the substrate.

2. A process for forming an aluminum oxide film comprising the steps of:
- providing a target substrate and maintaining the target substrate at a temperature less than 100° C.;
- contacting an organoaluminum compound as an aluminum source with the target substrate for deposition using a carrier gas to cause a dissociation reaction of the compound;
- introducing an energy source to the substrate to form an aluminum film through a decomposition reaction of the material adsorbed on the substrate; and
- introducing an oxygen-containing gas and a heat energy source to oxidize the aluminum film.

3. The process as claimed in claim 2, wherein the organoaluminum compound is at least one selected from the group consisting of alkyl or alane compounds including triisobutyl aluminum, dimethyl-aluminum hydride, trimethyl-amine alane, triethylamine alane, and dimethylethyl-amine alane.

4. The process as claimed in claim 3, wherein the compound is dimethylethyl-amine alane.

5. The process as claimed in claim 2, wherein the carrier gas is any one selected from the group consisting of hydrogen, argon, helium, and nitrogen.

6. The process as claimed in claim 5, wherein the carrier gas is hydrogen.

7. The process as claimed in claim 2, wherein the energy source is plasma energy.

8. The process as claimed in claim 7, wherein the plasma is hydrogen plasma.

9. The process as claimed in claim 2, wherein the oxygen-containing gas is at least one selected from the group consisting of vapor ($H_2O$), hydrogen peroxide ($H_2O_2$), nitrogen monoxide ($N_2O$), oxygen ($O_2$), and ozone ($O_3$).

10. The process as claimed in claim 2, wherein the heat energy source is oxygen plasma.

11. The process as claimed in claim 2, further comprising the step of repeating the step of forming the aluminum film at least twice prior to the oxidization step to laminate the aluminum film.

12. The process as claimed in claim 2, further comprising the step of repeating the entire procedure at least twice to laminate the aluminum oxide film.

* * * * *